(12) United States Patent
Jamison et al.

(10) Patent No.: US 6,345,399 B1
(45) Date of Patent: Feb. 12, 2002

(54) HARD MASK PROCESS TO PREVENT SURFACE ROUGHNESS FOR SELECTIVE DIELECTRIC ETCHING

(75) Inventors: Paul C. Jamison, Hopwell Junction; Tina Wagner, Newburgh; Richard S. Wise, New Windsor; Hongwen Yan, Somers, all of NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/671,408

(22) Filed: Sep. 27, 2000

(51) Int. Cl.$^7$ ............................................. H01L 21/311
(52) U.S. Cl. ........................ 4/702; 438/545; 438/700; 438/763; 204/192.35; 156/11
(58) Field of Search ................... 438/702, 545, 438/763, 700; 156/11; 204/192–35

(56) References Cited

U.S. PATENT DOCUMENTS

| | | | |
|---|---|---|---|
| 3,447,984 A | * | 6/1969 | Castrucci et al. ............. 156/11 |
| 3,986,697 A | * | 10/1976 | Zielinski ...................... 156/11 |
| 4,439,270 A | | 3/1984 | Powell et al. |
| 5,882,489 A | * | 3/1999 | Bersin et al. .......... 204/192.35 |
| 6,090,722 A | * | 7/2000 | Armacost et al. ........... 438/763 |

* cited by examiner

Primary Examiner—Richard Elms
Assistant Examiner—Pho Luu
(74) Attorney, Agent, or Firm—Scully, Scott, Murphy & Presser; Steven Capella, Esq

(57) ABSTRACT

The propagation of microfissures from a photoresist to an underlying material layer during lithography and etching can be substantially prevented by placing a hard mask between the photoresist and the material layer to be etched. Specifically, the microfissure propagation is substantially prevented by (a) forming a compressive hard mask on a surface of a non-compressive material layer that is to be patterned by lithography and etching; (b) forming a patterned photoresist on said hard mask, wherein a portion of said hard mask is exposed; (c) removing said exposed portion of said hard mask so as to expose a portion of said non-compressive material layer; and (d) transferring said pattern from said patterned photoresist to said exposed portion of said material layer by etching, wherein said hard mask is selective to said etching and thus substantially prevents the propagation of photoresist microfissures to said material layer.

17 Claims, 6 Drawing Sheets

HARD MASK PROCESS TO PREVENT SURFACE ROUGHNESS FOR SELECTIVE DIELECTRIC ETCHING

DESCRIPTION

1. Field of the Invention

The present invention relates to semiconductor device processing in which both lithography and etching are employed in forming a pattern in at least one material layer of a semiconductor structure. More particularly, the present invention is directed to a process whereby a thin, compressive hard mask is placed between a resist film and a non-compressive material layer being patterned which hard mask prevents the propagation of microfissures from the resist film into the underlying material layer. By employing a selective etch chemistry in conjunction with the inventive hard mask, the damage of the resist, i.e., microfissures, is not transferred through the hard mask, and surface roughness of the underlying non-compressive material layer is reduced.

2. Background of the Invention

The extension of 248 nm lithography in the semiconductor industry has in many cases led to the introduction of more sensitive photoresists. These photoresists have demonstrated poor performance with traditional etch processes with regard to image integrity via resist damage. The level of the photoresist damage has been found to vary inversely with the selectivity of the etch process to the photoresist. Processes with highly polymerizing chemistries, which are highly selective to photoresist, tend to result in increased levels of photoresist damage. For example, FIGS. 1 and 2 show results from a highly selective oxide etch process on a typical oxide stack (7000 Å boron silicate glass (BSG)) 10 containing photoresist 12. Specifically, FIG. 1 is a cross-section of a structure through a prior art patterning process before resist strip showing a substantial amount of photoresist 12 remaining after etching. In FIG. 2, the top of the oxide is shown following resist stripping. The roughness 16 around the edges of the opened pattern 14 will be transferred into subsequent levels, resulting in degraded device performance due to leakage and other concerns.

The inverse relationship between the level of damage to the top of the image and the photoresist selectivity has considerably narrowed (or in some cases removed entirely) the available process window for deep oxide etch. As the pitch for critical levels decreases, the amount of available photoresist is also reduced due to the constraints of optical lithography. This reduction in photoresist thickness requires the application of a more selective etch process. However, as the selectivity of the etch process is increased, the quality of the patterned image is substantially degraded, leading to unacceptable microcrevices (herein referred to as microfissures) in the etched material.

For example, the current deep trench mask open etches cannot meet the simultaneous requirements of resist selectivity and image integrity for very small ground rules, e.g., 150 nm or less. Another example is the current local interconnect level shorts yield degradation that results from very poor image integrity. The inverse relationship between the generation of microfissures and photoresist selectivity can be understood by a thermal stress model of the photoresist during a selective wet etch process, See FIG. 3. The photoresist 12 which includes polymer capping layer 13 is heated during the oxide etch process by ion and radical bombardment. The primary cooling mechanism for the photoresist is through evaporation of the photoresist etched products. When a highly polymerizing chemistry is used, the evaporative cooling of the photoresist is hampered. The resulting temperature increase in the resist film may lead to increased breakdown in the resist polymer chains, and subsequent cracking 18 of the resist surface, See FIG. 4. These cracks in the resist surface lead to fissures near the edges of open features, which expose the underlying surface to the etch chemistry.

In the traditional scheme described above, the oxide surface is exposed to the plasma wherever microfissures form in the photoresist. Because the prior art etch is designed to etch oxide, i.e., have a high oxide etch rate, the crevices in the resist are transferred into the underlying film.

In view of the above drawbacks with prior art patterning processes which include at least lithography and etching, there is a continued need to develop a new and improved method which substantially prevents the transfer of microfissures from the photoresist to the underlying material being patterned.

SUMMARY OF THE INVENTION

One object of the present invention is to provide a method of forming a pattern, such as a deep trench or local interconnect, in a non-compressive material layer requiring patterning whereby the method prevents the formation of microfissures, e.g., striations, in the final patterned material layer.

Another object of the present invention is to provide a method wherein the roughness about the patterned opening has been substantially reduced.

A further object of the present invention is to provide a method wherein the microfissures are prevented from propagating from the photoresist into the underlying material layer being patterned using a highly selective etch process.

A still further object of the present invention is to provide a method wherein the thickness of the photoresist may, in some instances, be substantially reduced from thicknesses that are typically employed in prior art patterning processes.

These and other objects and advantages are achieved in the present invention by forming a compressive hard mask between a photoresist layer and a non-compressive material layer to be patterned by etching, wherein the hard mask comprises a material that substantially prevents the transfer of microfissures that develop in the photoresist to the underlying material layer during etching.

Specifically, the present invention is directed to a method of substantially preventing the transfer of photoresist microfissures, e.g., striations, to a material layer to be patterned by lithography and etching, said method comprising:

(a) forming a compressive hard mask on a surface of a non-compressive material layer that is to be patterned by lithography and etching;

(b) forming a patterned photoresist on said hard mask, wherein a portion of said hard mask is exposed;

(c) removing said exposed portion of said hard mask so as to expose a portion of said non-compressive material layer; and (d) transferring said pattern from said patterned photoresist to said exposed portion of said material layer by etching, wherein said hard mask is selective to said etching and thus substantially prevents the propagation of photoresist microfissures to said material layer.

In one embodiment of the present invention, the opened hard mask formed in step (c) remains in the structure and serves as an etch stop or polishing layer for a subsequent etching or planarization process. In another embodiment, the opened hard mask is removed from the patterned structure after conducting step (d) above.

DETAILED DESCRIPTION OF THE INVENTION

The present invention which provides a method for substantially preventing the propagation of microfissures from the resist into an underlying material layer during patterning via etching will now be described in greater detail.

Figure 5A:
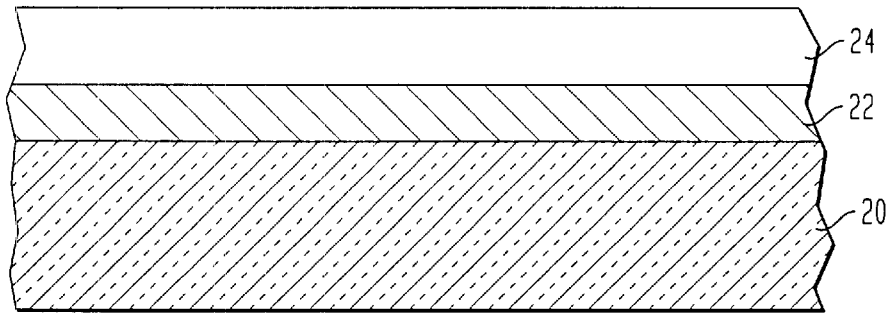
FIGS. 5A–5E are cross-sectional views illustrating a structure through the various processing steps of the present invention.

Reference is first made to FIGS. 5A–5E which are cross-sectional views of a structure during the various processing steps of the inventive method. Specifically, FIG. 5A shows an initial structure of the present invention which includes non-compressive material layer 20, compressive hard mask 22 formed on a surface of material layer 20 and photoresist 24 formed on compressive hard mask 22.

The term "non-compressive material layer" denotes any material layer of a semiconductor structure that when under tensile stress exhibits a concave profile relative to an underlying substrate. Illustrative examples of a material that fits the above description of a non-compressive material include, but are not limited to: semiconductor substrates (wafers of chips) composed of Si, Ge, SiGe, GaAs, GaP, InAs, InP, other III/V compound semiconductors, silicon-on-insulators (SOIs), layered semiconductors such as Si/SiGe; inorganic dielectrics such as $SiO_2$, $Al_2O_3$, $Ta_2O_5$, doped silicate glass such as boron silicate glass (BSG), arsenic silicate glass (ASG) and phosphorus silicate glass (PSG), perovskite-type oxides including $BaTiO_3$ (BTO), $SrTiO_3$ (STO), $(Ba,Sr)TiO_3$ (BST), $(Pb,La,Zr)TiO_3$ (PLZT), and $SrBi_2(Ti,Nb)$ $O_9$ (SBTN); conductive metals such as W, Pt, Au, Ag, and alloys thereof; and other like non-compressive materials. Combinations of one or more of the above-mentioned non-compressive material layers such as $SiO_2$ on a Si-containing substrate are also contemplated herein. One highly preferred non-compressive material layer employed in the present invention is a doped silicate glass such as BSG.

The non-compressive material layer employed in the present invention is formed utilizing conventional processing techniques that are well known to those skilled in the art. For example, when the material layer is an inorganic dielectric such as $SiO_2$, the inorganic dielectric may be either thermally grown or, alternatively the inorganic dielectric layer may be formed on another material layer using a conventional deposition process such as chemical vapor deposition (CVD), plasma-assisted CVD, sputtering, plating, chemical solution deposition, evaporation and other like deposition processes. The thickness of the non-compressive material layer may vary depending on the type of material employed and it is not critical to the present invention.

The term "compressive hard mask" denotes an etch stop layer that when under a compressive stress has a convex profile relative to an underlying substrate. Suitable examples of compressive hard mask materials that may be employed in the present invention include, but are not limited to: silicon nitride ($Si_3N_4$), titanium nitride (TiN), tantalum nitride (TaN), and other like compressive hard mask materials. Combinations of one or more of the above-mentioned compressive hard mask materials are also contemplated herein. A highly preferred compressive hard mask employed in the present invention is $Si_3N_4$.

Compressive hard mask 22 is formed on a surface of non-compressive material layer 20 by utilizing conventional deposition processes that are well known to those skilled in the art. For example, the compressive hard mask material may be formed by CVD, plasma-assisted CVD, plating, evaporation, sputtering, chemical solution deposition and other like deposition processes. The thickness of the compressive material layer may vary, but the thickness must be sufficiently thick enough to prevent the propagation of microfissures into the non-compressive material layer. A typical thickness for the compressive hard mask employed in the present invention is from about 500 to about 2000 Å, with a thickness of from about 800 to about 1200 Å being more highly preferred.

Photoresist 24 which is formed on a surface of compressive hard mask 22 includes any conventional resist that can be patterned by lithography. The photoresists are typically composed of hydrocarbon-containing polymers and copolymers which do not contain oxygen therein. The photoresist is applied to the compressive hard mask utilizing conventional deposition processes such as spin-on coating, dip coating, brushing, evaporation and other like deposition processes.

In some instances, the presence of the compressive hard mask material allows for a reduction in the thickness of the deposited photoresist to a value that is somewhat less than heretofore reported utilizing prior art lithography and etching processes. Specifically, in the present invention, the final thickness of the deposition photoresist film is from about 3000 to about 8000 Å, with a final thickness of from about 4000 to about 5000 Å being more highly preferred.

Figure 5B:
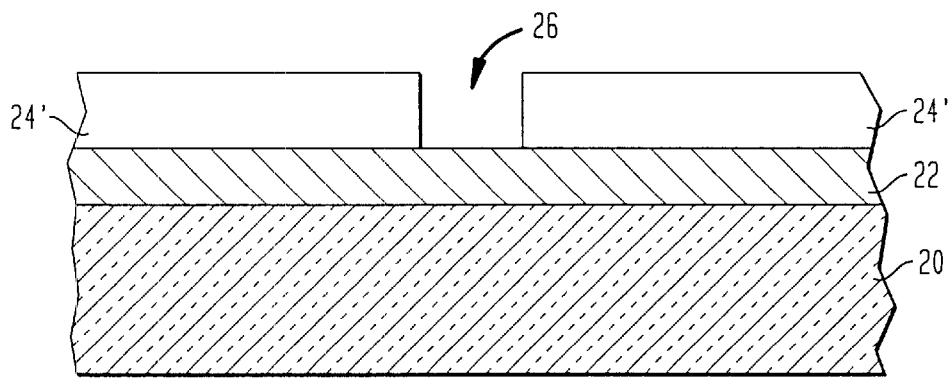

FIG. 5B show the structure after photoresist 24 has been patterned by a conventional lithography process.

Specifically, patterned photoresist 24' having opening 26 is formed by first exposing the surface of the photoresist to a pattern of radiation and thereafter developing the pattern utilizing a conventional developer solution that is highly selective in removing patterned areas of the photoresist. As illustrated in FIG. 5B, the lithography step exposes a portion of the underlying compressive hard mask.

Figure 5C:
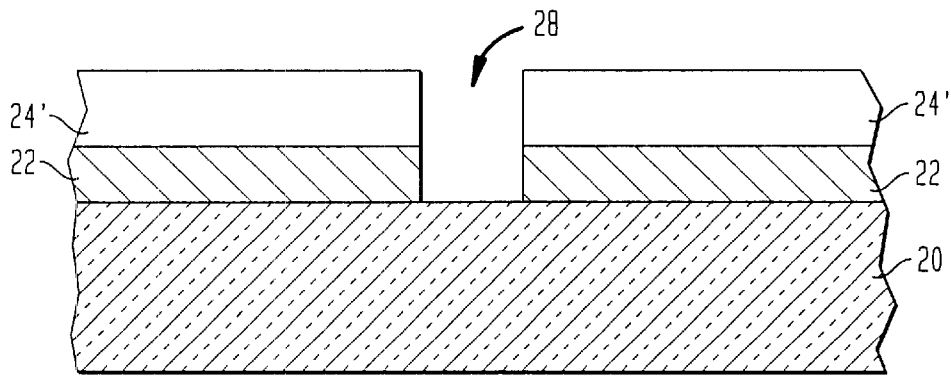

FIG. 5C illustrates the structure after performing a hard mask open etching process wherein the exposed portion of the compressive hard mask is removed stopping on material layer 20 utilizing an etching process that is highly selective in removing the hard mask as compared to photoresist and underlying material layer 20. Specifically, the structure of FIG. 5C includes opening 28 in the compressive hard mask that exposes a portion of the underlying non-compressive material layer.

The hard mask etch opening step employed in the present invention may be carried out utilizing any conventional dry etch process such as reactive-ion etching (RIE), plasma-etching, or ion beam etching. It also may be possible, but not highly preferred, to utilize a wet chemical etch process in which a chemical etchant having a high selective for the hard mask is employed.

Figure 5D:
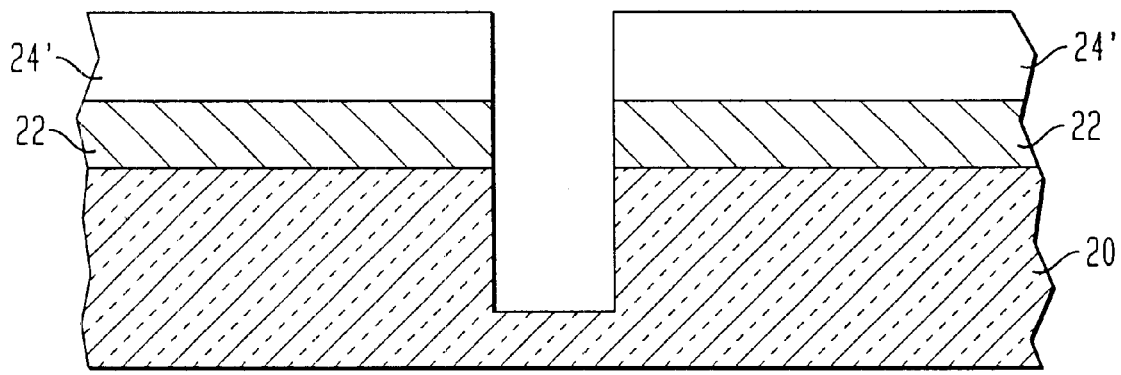

FIG. 5D illustrates the structure that is obtained after the pattern is transferred to the underlying non-compressive material layer. It is noted that although FIG. 5D illustrates a partially patterned non-compressive material layer, the present invention also contemplates forming the pattern completely through the non-compressive material layer. In this step of the present invention, the pattern is transferred to the non-compressive material layer by utilizing one of the above-mentioned dry etching processes. The etch process often must be highly selective to an underlying etch stop layer (e.g., $Si_3N_4$)

Figure 5E:
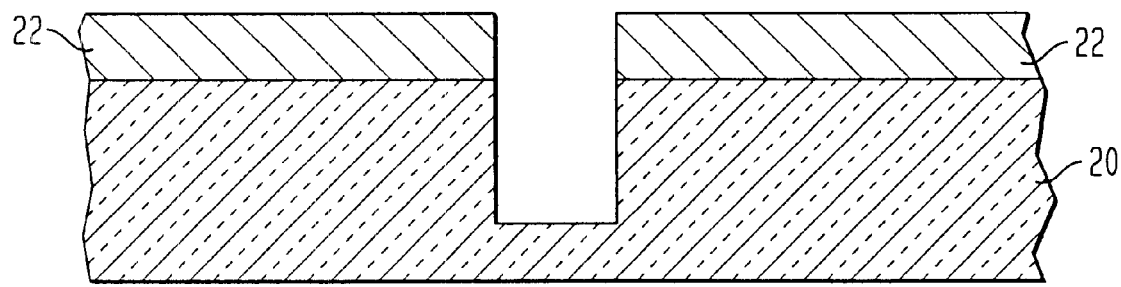

FIG. 5E shows the structure after patterned photoresist 24' has been removed from the structure by utilizing a conventional resist stripping process well known to those skilled in the art.

It should be noted that the patterned structure may be used in forming an isolation trench in a semiconductor substrate, via contacts, a capacitor or transistor that is surrounded by a non-compressive material layer, an interconnect region between various levels of an interconnect structure or other like semiconductor structure wherein a patterned area is required. As such the inventive method can be used in conjunction with a wide variety of other well known semiconductor processing techniques. If desired, the hard mask may be removed from the structure, or it may remain therein so as to provide an etch stop layer for a subsequent etching or planarization process.

Figure 1:
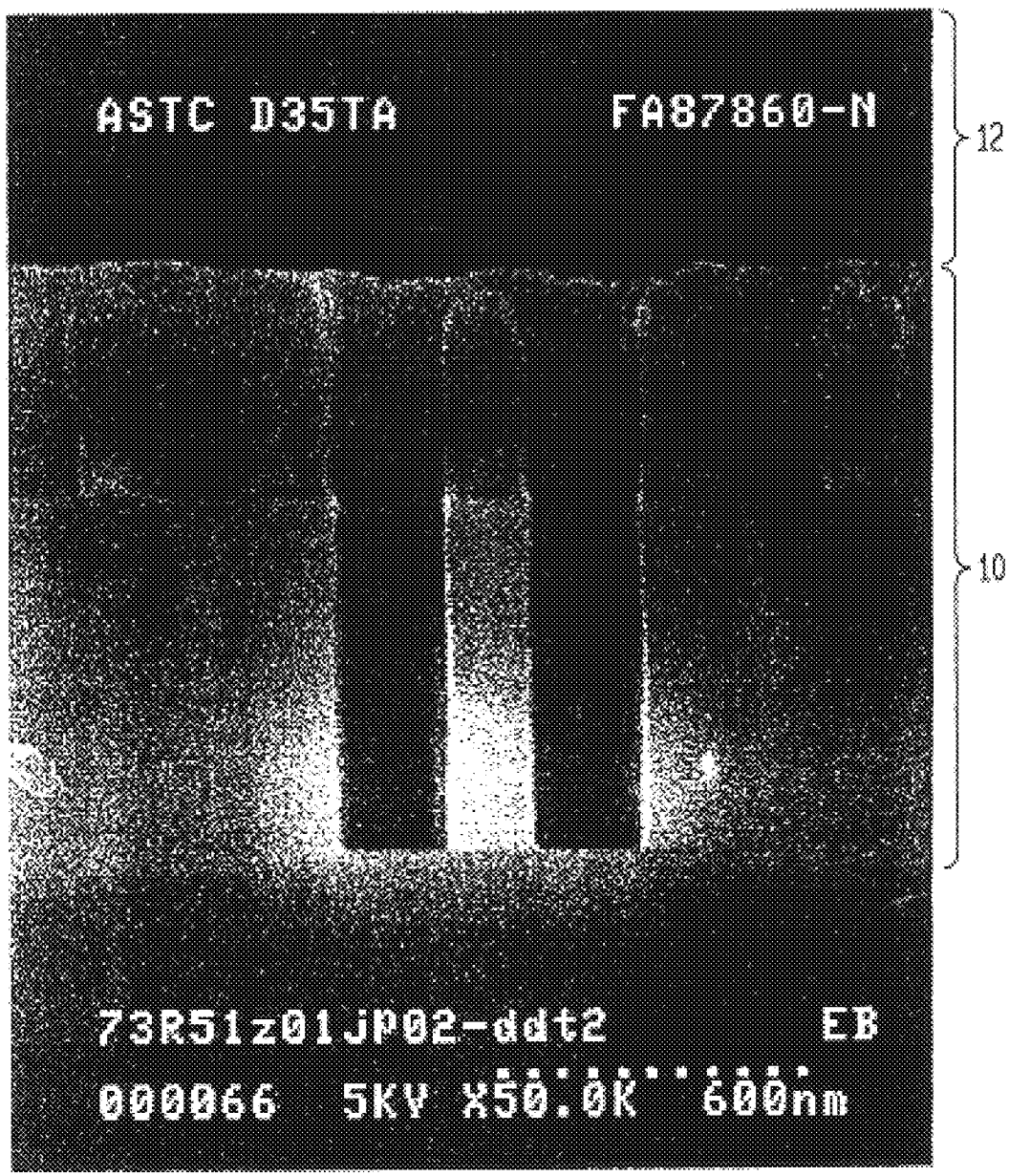
FIG. 1 is a cross section of a Scanning Electron Microgram (SEM) of a prior art patterned structure prior to resist stripping.
Figure 2:
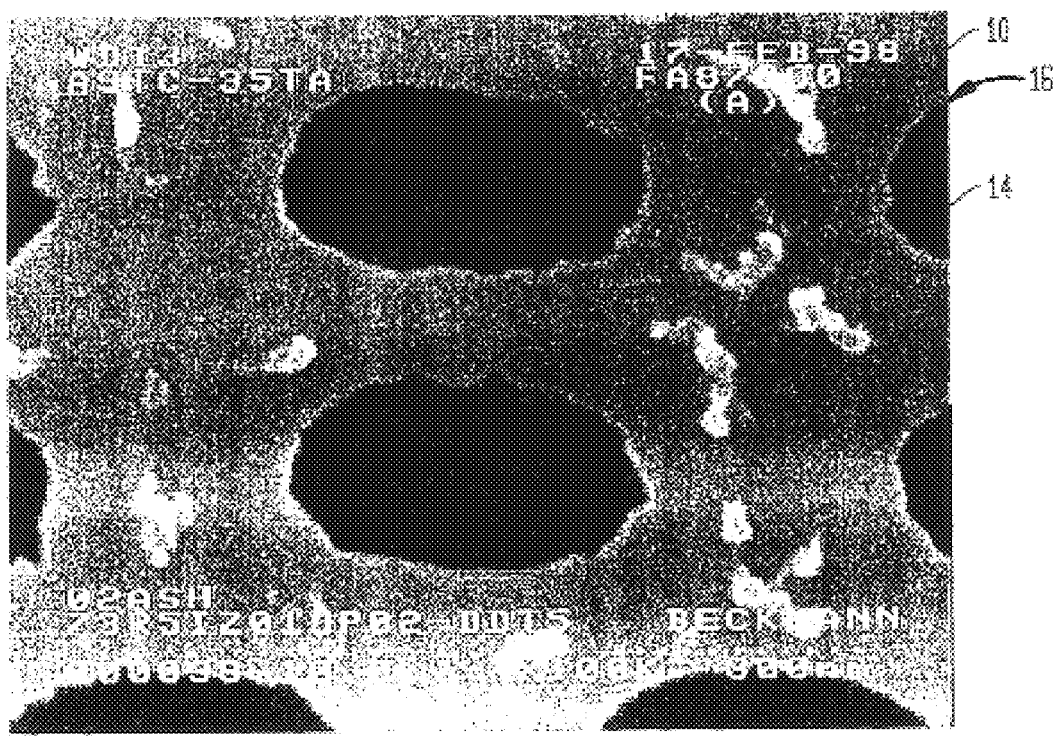
FIG. 2 is a top view of a SEM of the patterned structure of FIG. 1 after resist stripping.
Figure 3:
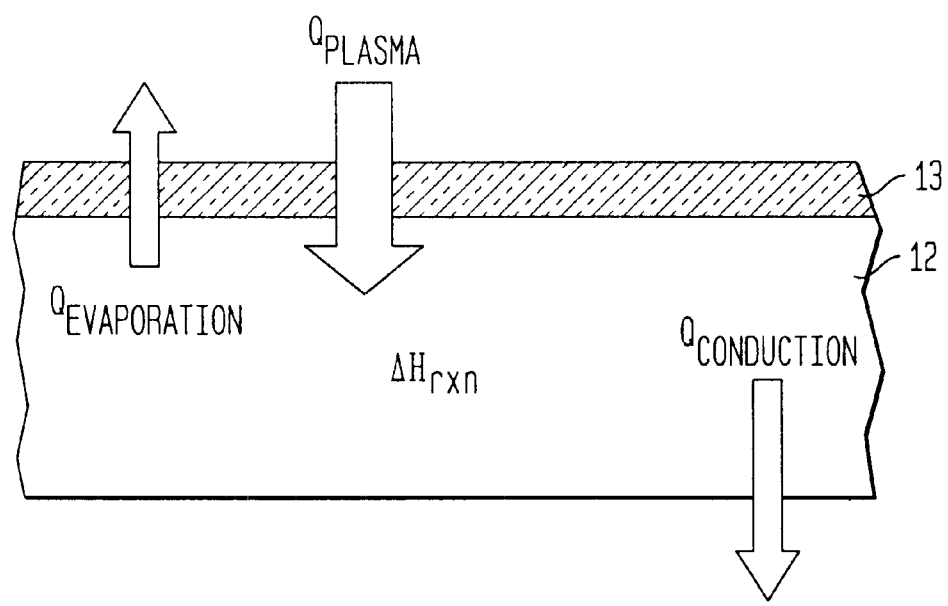
FIG. 3 is an illustration of the thermal stress model for microfissure formation.
Figure 4:
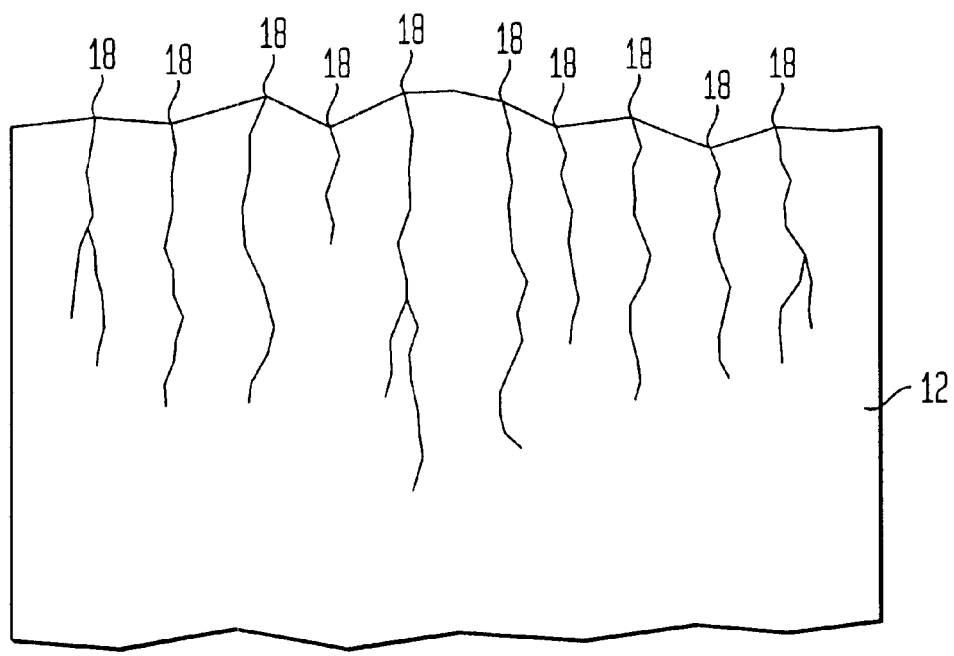
FIG. 4 is an illustration of crack propagation leading to microfissure formation and propagation in a photoresist.
Figure 6:
FIG. 6 is a cross-sectional view of a SEM of an opened feature with 1000 Å nitride cap on a BSG layer.
Figure 7:
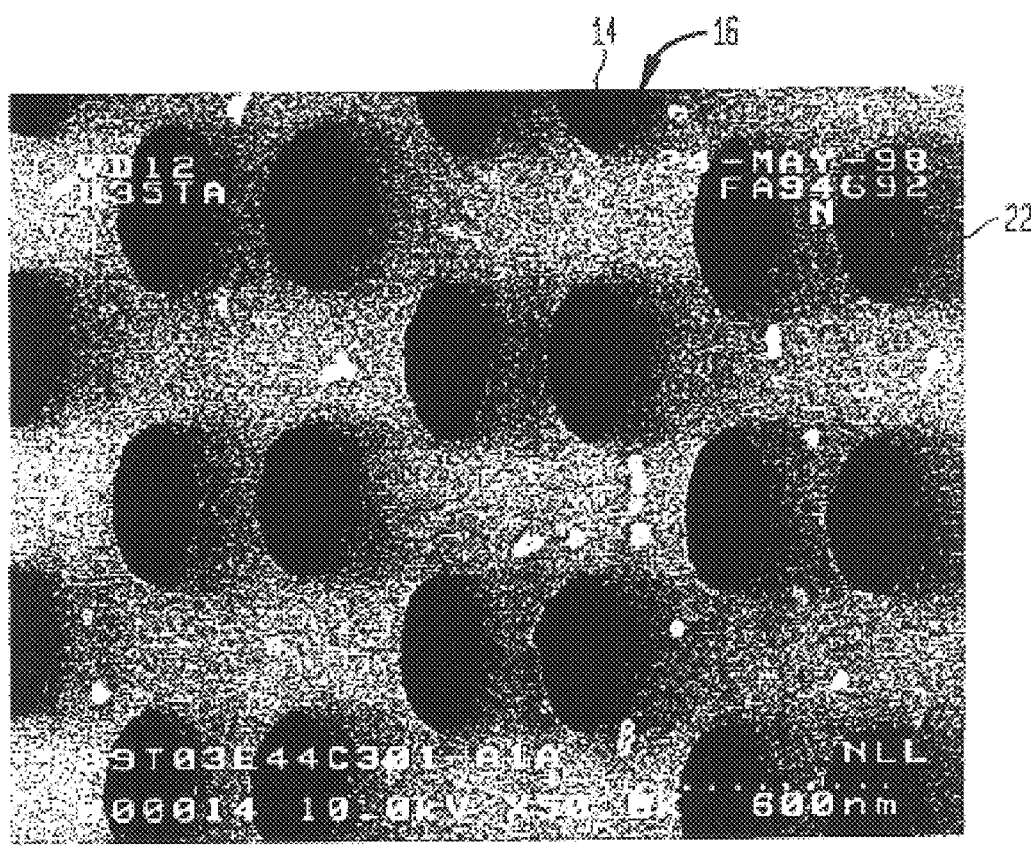
FIG. 7 is a top view of the nitride surface following resist strip of FIG. 6.

FIGS. 6 and 7 show the results from an identical oxide etch process to that utilized in FIGS. 1 and 2 with the exception that 1000 Å silicon nitride hard mask was placed between the oxide, i.e., material layer, and the photoresist, and a nitride hard mask open etching step was added to the process. In FIG. 7, the top down image of the nitride hard mask is shown. Relative to FIG. 2, the amount of microfissures is substantially reduced in FIG. 7 as compared to FIG. 2, despite the fact that a nitride open etching step was added to the process. The application of such a hard mask allows one to utilize a much more selective chemistry without incurring the tradeoff with the microfissuring of the oxide surface. Moreover, it may permit the use of a thinner photoresist than heretofore possible utilizing conventional patterning processes.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

Having thus described our invention in detail, what we claim as new and desire to secure by the Letters Patent is:

1. A method for preventing the formation of photoresist microfissures in a material layer to be patterned by lithography and etching, said method comprising the steps of:
   (a) forming a compressive hard mask on a surface of a non-compressive material layer that is to be patterned by lithography and etching;
   (b) forming a patterned photoresist on said hard mask, wherein a portion of said hard mask is exposed;
   (c) removing said exposed portion of said hard mask so as to expose a portion of said non-compressive material layer; and
   (d) transferring said pattern from said patterned photoresist to said exposed portion of said material layer by etching, wherein said hard mask is selective to said etching and thus substantially prevents the propagation of photoresist microfissures to said material layer.

2. The method of claim 1 wherein said non-compressive material layer is a semiconductor substrate, an inorganic dielectric, a conductive metal or a combination thereof.

3. The method of claim 2 wherein said non-compressive material is an inorganic dielectric selected from the group consisting of $SiO_2$, $Al_2O_3$, a pervoskite-type oxide and a doped silicate glass.

4. The method of claim 2 wherein said non-compressive material layer is $SiO_2$ that is formed on a Si-containing substrate.

5. The method of claim 1 wherein said compressive hard mask is composed of silicon nitride, titanium nitride, tantalum nitride or a combination thereof.

6. The method of claim 5 wherein said compressive hard mask is composed of silicon nitride.

7. The method of claim 1 wherein said compressive hard mask has a thickness of from about 500 to about 2000 Å.

8. The method of claim 7 wherein said compressive hard mask has a thickness of from about 800 to about 1200 Å.

9. The method of claim 1 wherein said compressive hard mask is formed by a deposition process selected from the group consisting of chemical vapor deposition, plasma-assisted chemical vapor deposition, plating, evaporation, sputtering and chemical solution deposition.

10. The method of claim 1 wherein said (b) includes exposing the photoresist to a pattern of radiation and developing the pattern utilizing a chemical developer.

11. The method of claim 1 wherein step (c) includes a dry etch process selected from the group consisting of reactive-ion etching, plasma-etching and ion beam etching.

12. The method of claim 1 wherein step (d) includes a dry etch process selected from the group consisting of reactive-ion etching, plasma-etching and ion beam etching.

13. The method of claim 1 wherein said patterned photoresist has a thickness of from about 2000 to about 8000 Å.

14. The method of claim 13 wherein said patterned photoresist has a thickness of from about 4000 to about 5000 Å.

15. The method of claim 1 further comprising stripping said patterned photoresist after conducting step (d).

16. The method of claim 1 further comprising removing the hard mask after conducting step (d).

17. The method of claim 1 wherein said pattern is a trench used in forming an isolation region in said material layer.

* * * * *